(12) United States Patent
Cao

(10) Patent No.: US 10,263,419 B2
(45) Date of Patent: Apr. 16, 2019

(54) TRANSIENT VOLTAGE PROTECTION CIRCUITS, DEVICES, AND METHODS

(71) Applicant: Infineon Technologies AG, Neubiberg (DE)

(72) Inventor: Yiqun Cao, Munich (DE)

(73) Assignee: Infineon Technologies AG, Neubiberg (DE)

( * ) Notice: Subject to any disclaimer, the term of this patent is extended or adjusted under 35 U.S.C. 154(b) by 260 days.

(21) Appl. No.: 15/183,049

(22) Filed: Jun. 15, 2016

(65) Prior Publication Data

US 2017/0366001 A1     Dec. 21, 2017

(51) Int. Cl.
*H02H 9/04* (2006.01)
*H01L 25/16* (2006.01)
(Continued)

(52) U.S. Cl.
CPC ............. *H02H 9/045* (2013.01); *H01L 25/16* (2013.01); *H01L 27/0647* (2013.01);
(Continued)

(58) Field of Classification Search
USPC .................. 361/56, 91.1, 111; 257/355–360
See application file for complete search history.

(56) References Cited

U.S. PATENT DOCUMENTS 8,664,690 B1 *  3/2014  Chen ................... H01L 27/0262
                                                                    257/107
2006/0278930 A1  12/2006  Huang
(Continued)

FOREIGN PATENT DOCUMENTS

CN          1881582 A    12/2006
CN          1979854 A     6/2007
CN        102468297 A     5/2012

OTHER PUBLICATIONS

Office Action, in the Chinese language, from counterpart Chinese Application No. 20171045291.5, dated Oct. 15, 2018, 7 pp.

*Primary Examiner* — Danny Nguyen
(74) *Attorney, Agent, or Firm* — Shumaker & Sieffert, P.A.

(57) ABSTRACT

A transient voltage protection circuit includes a first input/output pad, a second input/output pad, and a trigger circuit coupled between the first input/output pad and the second input/output pad. The trigger circuit includes a first trigger element which includes a first input/output node, a second input/output node, a third input/output node, and a first substrate diode coupled to the third input/output node of the first trigger element. The trigger circuit further includes a first resistor coupled between the first input/output node of the first trigger element and the second input/output node of the first trigger element. The trigger circuit further includes a second trigger element which includes a first input/output node, a second input/output node, a third input/output node, wherein the second input/output node of the first trigger element is coupled to the first input/output node of the second trigger element, and a second substrate diode coupled to the third input/output node of the second trigger element. The trigger circuit further includes a second resistor coupled between the first input/output node of the second trigger element and the second input/output node of the second trigger element.

24 Claims, 11 Drawing Sheets

(51) Int. Cl.
*H01L 27/06* (2006.01)
*H01L 49/02* (2006.01)
*H01L 29/06* (2006.01)
*H01L 29/10* (2006.01)
*H01L 29/866* (2006.01)
*H01L 29/78* (2006.01)

(52) U.S. Cl.
CPC .......... *H01L 28/20* (2013.01); *H01L 29/0657* (2013.01); *H01L 29/10* (2013.01); *H01L 29/866* (2013.01); *H01L 29/78* (2013.01)

(56) References Cited

U.S. PATENT DOCUMENTS

| | | | | |
|---|---|---|---|---|
| 2011/0304940 | A1* | 12/2011 | Cao | H01L 23/60 |
| | | | | 361/56 |
| 2012/0119330 | A1* | 5/2012 | Hwang | H01L 27/0259 |
| | | | | 257/566 |
| 2013/0075854 | A1* | 3/2013 | Chang | H01L 27/0259 |
| | | | | 257/477 |

* cited by examiner

TRANSIENT VOLTAGE PROTECTION CIRCUITS, DEVICES, AND METHODS

TECHNICAL FIELD

The present invention relates generally to electronic circuits and devices, and, in particular embodiments, to transient voltage protection circuits, devices, and methods.

BACKGROUND

Transient voltage spikes and voltage pulses in electronic circuits can be caused by an electrostatic discharge (ESD) event. Such ESD events can occur when two charged objects are brought into close physical proximity and are the result of an imbalance of electric potential between the two objects. A common example of an ESD event is the release of static electricity by a person touching, for example, a metal doorknob. Transient voltage spikes and pulses frequently exceed the safe operating margin of sensitive electronic components, semiconductor devices, discrete circuits, and integrated circuits (ICs) causing permanent damage. Large ESD events may render the affected component inoperable whereas repeated smaller ESD events can cause damage over time leading to reliability issues and eventual inoperability.

ESD protection circuits may be implemented as discrete circuits, but many ICs include integrated ESD protection circuits designed to protect the IC from ESD events and other transient voltage events. Typical ESD protection circuits ensure a low impedance path that does not include the protected circuit in the event that an unsafe voltage value is met or exceeded. This can be accomplished through incorporation of passive or active circuit elements. Active clamp ESD protection circuits are designed to turn on when a trigger condition is met or exceeded. Such ESD protection circuits utilize trigger circuits to control active circuit elements such as transistors. In the event that a designed trigger voltage $V_{TR}$ is met or exceeded, the active circuit element acts as a discharge element providing an alternate path for the majority of the overvoltage current instead of passing through the protected circuit. Active clamp ESD protection circuits that are designed to operate in high voltage applications are referred to as high voltage active clamp (HVAC) circuits.

ESD protection circuits are often fabricated on bulk silicon technologies in order to maintain low costs. Bulk silicon technologies are commonly used for producing semiconductor components.

SUMMARY

In accordance with an embodiment of the present invention, a transient voltage protection circuit comprises a first input/output pad, a second input/output pad, and a trigger circuit coupled between the first input/output pad and the second input/output pad. The trigger circuit comprises a first trigger element which comprises a first input/output node, a second input/output node, a third input/output node, and a first substrate diode coupled to the third input/output node of the first trigger element. The trigger circuit further comprises a first resistor coupled between the first input/output node of the first trigger element and the second input/output node of the first trigger element. The trigger circuit further comprises a second trigger element which comprises a first input/output node, a second input/output node, a third input/output node, wherein the second input/output node of the first trigger element is coupled to the first input/output node of the second trigger element, and a second substrate diode coupled to the third input/output node of the second trigger element. The trigger circuit further comprises a second resistor coupled between the first input/output node of the second trigger element and the second input/output node of the second trigger element.

In accordance with an alternative embodiment of the present invention, an electrostatic discharge (ESD) protection circuit comprises a power MOSFET for discharging an electrostatic discharge current coupled between an input pad and an output of the ESD protection circuit. The ESD protection circuit further comprises a trigger circuit for triggering the power MOSFET wherein the trigger circuit is coupled to a gate node of the power MOSFET. The trigger circuit comprises a first trigger element string for controlling a gate to source voltage of the power MOSFET, wherein each trigger element of the first trigger element string comprises a bipolar transistor, a substrate diode, and a voltage divider to divide a voltage across adjacent trigger elements of the first trigger element string, and a second trigger element string for triggering the gate of the power MOSFET.

In accordance with an alternative embodiment of the present invention, an electrostatic discharge (ESD) protection device comprises a first trigger transistor disposed above a semiconductor substrate having a first doping type. The first trigger transistor comprises a first buried region of a second doping type disposed over the semiconductor substrate, a first well region of the first doping type, a first doped region of the first doping type disposed in the first well region, a second doped region of the second doping type disposed in the first well region, and a third doped region of the second doping type disposed over the first buried region, wherein the second doping type is opposite to the first doping type, and wherein the second doped region and the first well region form a first Zener diode. The ESD protection device further comprises a first substrate diode at an interface between the semiconductor substrate and the first well region and a first resistive layer disposed in or over the semiconductor substrate, the first resistive layer coupled between the first doped region and the second doped region.

In accordance with an alternative embodiment of the present invention, an electrostatic discharge protection system comprises a circuit board comprising a first pad and a second pad. The electrostatic discharge protection system further comprises a device under protection bonded to the circuit board coupled between the first pad and the second pad, and a power MOSFET bonded to the circuit board coupled between the first pad and the second pad, wherein the power MOSFET comprises a control node, and wherein the power MOSFET is configured to discharge a voltage that is negative relative to a ground voltage. The electrostatic discharge protection system further comprises a plurality of Zener NPN transistors bonded to the circuit board and coupled in series between the first pad and the control node of the power MOSFET and a plurality of resistors coupled between each of the plurality of Zener NPN transistors, wherein the plurality of resistors are configured to divide a voltage across adjacent ones of the plurality of Zener NPN transistors.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7A, 7B, and 7C illustrate cross sections of integrated circuit implementations of trigger element string ICs and trigger element strings, wherein FIG. 7A illustrates a cross section of a trigger element string IC which includes a transistor IC with a discrete resistor connecting the emitter and the base, FIG. 7B illustrates a cross section of a trigger circuit element formed using a single IC with a transistor and an integrated resistor connecting the emitter and the base, and FIG. 7C illustrates a cross section of a portion of a trigger element string IC.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
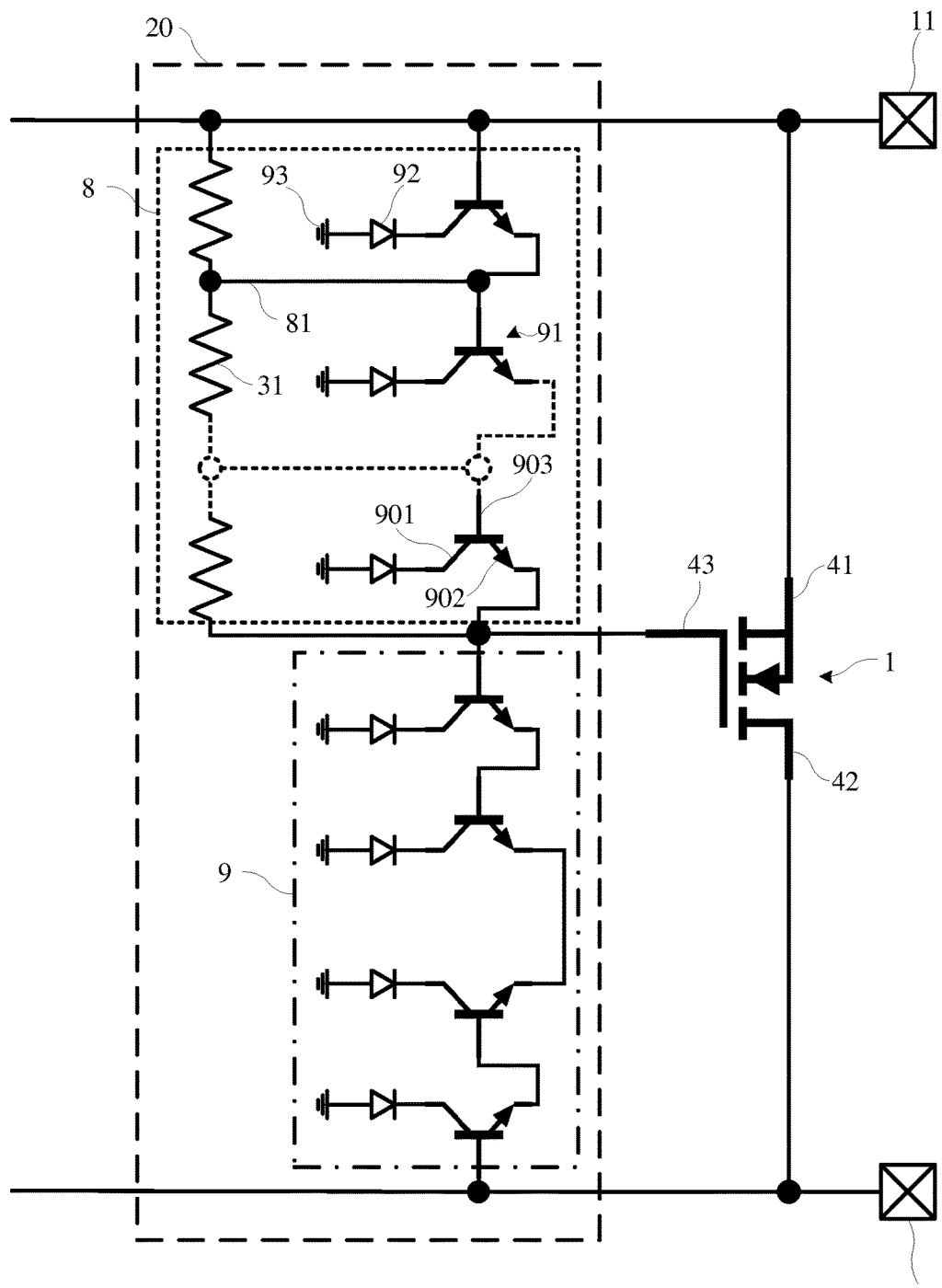
FIG. 1 illustrates a schematic diagram of an HVAC circuit for the protection of a circuit against negative overvoltages (relative to a reference voltage) which result from ESD events according to embodiments of the present invention.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Often, ESD protection circuits protect a circuit that is sensitive to ESD events from both positive and negative voltage transients. For integrated circuit design in power technologies, both a negative voltage class and a positive voltage class at a pin are often needed. For example, a pin may be rated to a maximum voltage rating of, e.g., ±40 V with respect to 0 V at a ground pin.

HVAC circuits are typically implemented using Zener diodes. In bulk power technologies, Zener diodes are obtained by forming NPN bipolar junction transistors (BJTs) and shorting the collector to base terminals of the NPN BJTs. However, the Zener breakdown voltage is about 6 V and is not suitable for many high voltage applications, especially for high negative voltage applications. Therefore, NPN transistors are used instead of Zener diodes so that the collector to base breakdown voltage is much higher than the emitter to base breakdown voltage resulting in higher voltage operation. However, even circuits based on NPN transistors are unable to provide a safe operating range especially for high negative voltage applications because of parasitic currents through the p-type substrate.

Furthermore, the area on an integrated circuit (IC) is often limited. As a result, implementation of ESD protection circuits take into account the size on the chip as well as the functionality of the circuit elements. For example, individual diodes with high breakdown voltages take up large areas on an IC relative to other devices used in ESD protection circuits. As an alternative, strings of low voltage diodes may be used, but the area efficiency per achieved voltage requirement is even less efficient than a single diode. If the voltage protection requirements of the circuit are too high or the available area on the IC is too low, diodes may be an infeasible solution to protect the circuit. HVAC circuits are more area efficient than diodes, but suffer from limitations due to parasitic currents as will be described further below. Thus, improved HVAC circuits are needed which occupy small areas on an IC and can protect circuits that operate in more negative voltage regimes than the critical voltage of inherent parasitic structures.

Descriptions are made with respect to various embodiments in a specific context, namely electronic circuits, and more particularly electrostatic discharge (ESD) protection circuits and devices. Some of the various embodiments described herein include ESD protection circuits with resistors, Zener diodes, and NPN bipolar junction transistors (BJTs). In other embodiments, aspects may also be applied to other applications involving any type of ESD protection circuit. It should be understood that embodiment protection circuits described herein may be applied to protecting components or devices from any type of voltage transient including ESD events and other surge events.

According to various embodiments, HVAC circuits disclosed herein maintain high performance and require minimal area on an IC while also limiting parasitic effects. As a result, these HVAC circuits offer protection for negative voltage classes beyond, for example, −20 V.

FIG. 1 illustrates a schematic diagram of an HVAC circuit for the protection of a circuit against overvoltages (relative to a reference voltage) which result from ESD events according to an embodiment of the present invention. According to this embodiment, the HVAC circuit is designed to specifically protect against negative overvoltages.

The HVAC circuit protects against negative overvoltages of a device under protection (DUP) connected between a first circuit node 11 and a second circuit node 12. The first circuit node 11 may be an anode pin and the second circuit node 12 may be a cathode pin. The DUP may be a component or collection of components comprising a circuit, integrated or otherwise, being protected from an overvoltage outside the safe operating margin of the DUP caused by an ESD event or other transient voltage event.

For this purpose, the HVAC circuit includes a discharge element connected between the first circuit node 11 and the second circuit node 12. The discharge element is configured to allow a majority of an overvoltage current to pass directly from the first circuit node 11 to the second circuit node 12 without passing through the DUP. In one embodiment, the discharge element is a large power metal-oxide semiconductor field-effect transistor (power MOSFET 1) used as a switch. In one embodiment, the discharge element is an n-channel metal-oxide-semiconductor field-effect transistor (nMOS transistor) operating in enhancement mode.

According to various embodiments, a trigger circuit 20 is included to control the passage of the overvoltage current through the power MOSFET 1 by a controlled connection between the trigger circuit 20 and the power MOSFET 1.

During normal operation, voltages across the first circuit node 11 and the second circuit node 12 remain below a trigger value $V_{TR}$ and the power MOSFET 1 does not allow significant current to pass through it. During an ESD event or other transient voltage event, a voltage $V_{ESD}$ occurs between the first circuit node 11 and the second circuit node 12 for a short time duration. This overvoltage causes the trigger circuit 20 to raise the gate to source voltage of the power MOSFET 1 to trigger passage of overvoltage current through the power MOSFET 1. Any remaining portion of the overvoltage current is within the safe operating margin of the protected circuit and does not cause damage to the protected circuit. The goal of the HVAC circuit, amongst other things, is to turn on the power MOSFET 1 at a desired trigger voltage, and once the power MOSFET 1 is turned ON, the ON resistance has to be as low as possible so that higher levels of the overvoltage current can be discharged without damaging the power MOSFET 1. The gate to source voltage applied on the power MOSFET 1 determines the failure voltage and current at failure. Therefore, the gate to source voltage has to be controlled by the trigger circuit while maximizing the turn-on characteristics.

According to various embodiments, the power MOSFET 1 is a three terminal device and includes source 41, drain 42, and gate 43 connections. The gate 43 connection of the power MOSFET 1 is the controlled connection between the trigger circuit 20 and the power MOSFET 1. During an overvoltage event, the power MOSFET 1 conducts the overvoltage current via a load path which runs between the drain 42 and the source 41 connections. The source 41 and drain 42 connections are connected between the first circuit node 11 and the second circuit node 12. The power MOSFET 1 can assume an on or off state determined by the trigger circuit 20. In the on state, the power MOSFET 1 allows the passage of current between the drain 42 and the source 41 connections and in the off state the power MOSFET 1 denies the passage of current between the drain 42 and the source 41 connections. The gate 43 connection between the trigger circuit 20 and the power MOSFET 1 determines the state of the power MOSFET 1.

Referring to FIG. 1, the trigger circuit 20 includes a first trigger element string 8 connected between the first circuit node 11 and the gate 43 and a second trigger element string 9 connected between the gate 43 and the second circuit node 12. The first trigger element string 8 is configured for protection against gate oxide breakdown of the power MOSFET 1 due to large gate to source voltage. The second trigger element string 9 is configured to raise the gate to source voltage to trigger the power MOSFET 1 during an ESD event.

As described herein, a string of trigger elements includes a plurality of trigger elements of a particular type, e.g., a diode string may include one diode or a plurality of diodes. The constituent circuit elements in a given string may or may not be identical to one another. Each constituent trigger element in a given string is connected in series, but may be connected either serially or anti-serially within the string. The number and orientation of the components of the first and second trigger element strings 8, 9 are determined by the specific requirements (e.g. voltage requirements) of the DUP. In the illustrated embodiment of FIG. 1, each trigger element of the first trigger element string 8 comprises a transistor 91, a substrate diode 92, a connection to a reference voltage node, and a resistor 31, as will be described further below. Similarly, each trigger element of the second trigger element string 9 comprises a transistor 91, a substrate diode 92, and a connection to a reference voltage node.

According to various embodiments, the trigger circuit 20 further includes transistors 91, which may be a BJT transistor such as an NPN transistor, for example. In various embodiments, the transistor 91 comprises a Zener diode and is a Zener NPN transistor in one embodiment. In some embodiments, the transistor 91 may be n-channel or p-channel as examples. Additionally, a transistor included in the trigger circuit 20 may be a bipolar junction transistor (BJT), junction field-effect transistor (JFET) or metal-oxide-semiconductor field-effect transistor (MOSFET), for example. In various embodiments, the trigger circuit 20 may further include passive elements such as resistors, capacitors, inductors, and diodes as well as active elements such as transistors and thyristors, for example. The trigger circuit 20 may be designed to have a negative or positive $V_{TR}$ relative to a reference ground. Additionally, the trigger circuit 20 may be designed to have a dynamic $V_{TR}$.

In one embodiment, each of the transistors 91 is a bipolar junction transistor (BJT) and specifically an NPN BJT in one embodiment. Each transistor 91 includes a collector 901, emitter 902, and base 903 and is connected such that the collector 901 is connected only through a parasitic substrate diode 92 to a reference voltage node such as ground. Constituent transistors 91 in a first trigger element string 8 may be oriented such that the emitter 902 of a transistor 91 connects to the base 903 of the next transistor 91 in a serial configuration. In the second trigger element string 9, the emitter 902 of a transistor 91 may be connected to the emitter 902 of the next transistor 91 in an anti-serial configuration.

P-type semiconductor substrates are a common starting substrate for manufacturing semiconductor devices. When the transistor 91 is fabricated on a p-type semiconductor substrate, an n-type region is used to isolate adjacent devices on the substrate. This n-type region may be an epitaxial buried layer and may be doped highly. The resulting p-n junction between the p-type substrate and the n-type region forms a substrate diode 92. Therefore, each transistor 91 has a corresponding substrate diode 92 between the collector 901 and the p-type substrate. In one embodiment, shown here, the substrate is connected to ground 93. Alternatively, the substrate is connected to a reference voltage different from the ground voltage.

Figure 2:
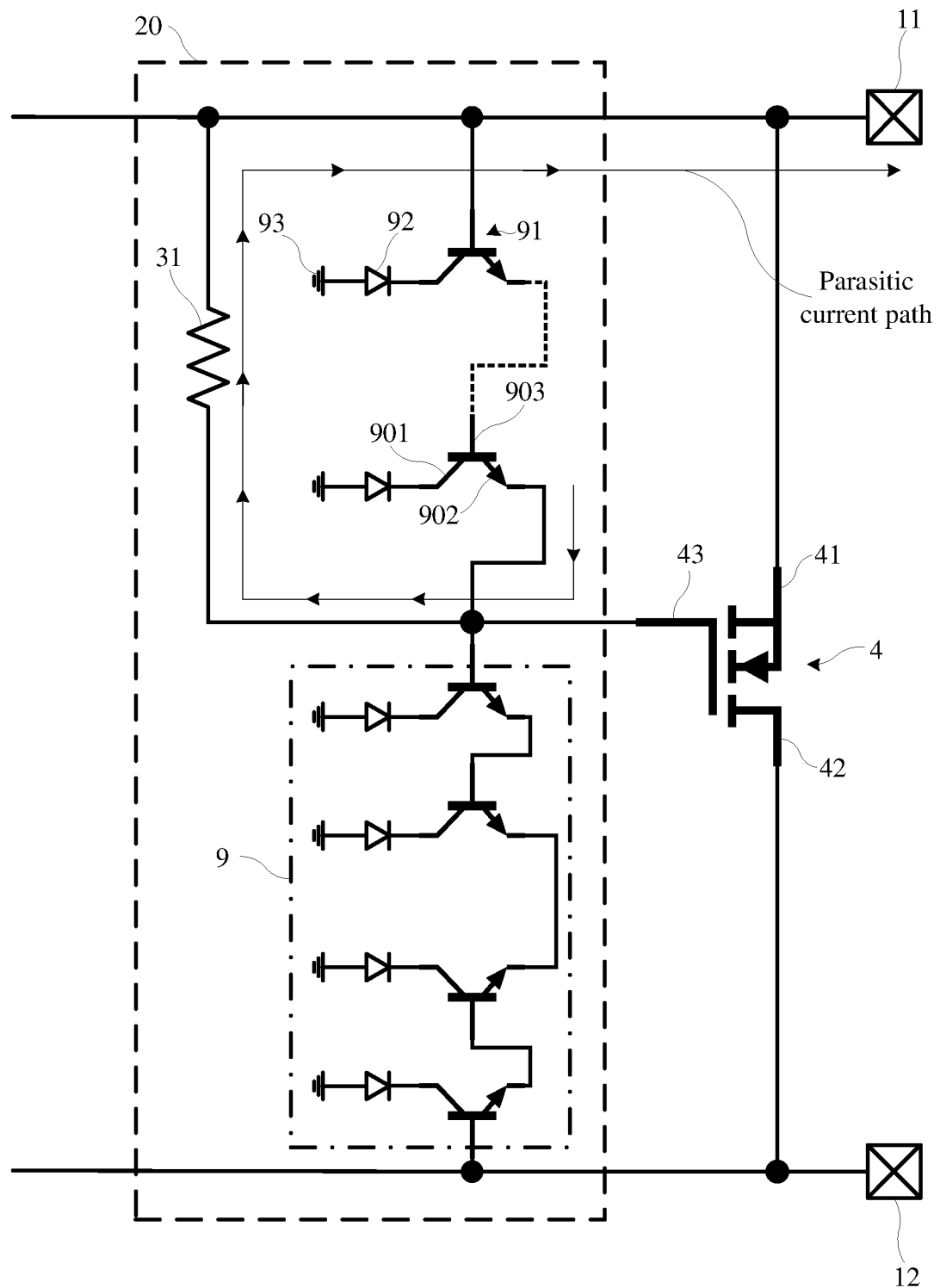
FIG. 2 illustrates a HVAC circuit that has a detrimental parasitic current path in the absence of the protective aspects of the present invention.

FIG. 2 illustrates HVAC circuit that has a detrimental parasitic current path in the absence of the protective aspects of the present invention.

The inventors of this application have identified that a HVAC circuit without the protective aspects described in various embodiments of the present invention encounters a technical issue caused by the parasitic substrate diode 92 between the p-type substrate and the n-type buried isolation layer. The substrate diode 92 along with p-type active regions such as from the Zener diode forms a further parasitic PNP bipolar transistor. The substrate connection to ground introduces an undesirable parasitic current path between the substrate and the pin being protected. Because the base of the bipolar transistor is floating, collector/emitter voltage ($V_{CEO}$) of the open base bipolar transistor is less than the collector/base breakdown voltage. This results in a parasitic path between the substrate diode 92 passing from the collector to the emitter and through the transistor 91. This parasitic current may reach the pin at the first circuit node 11 through, for example, a common well connection. This uncontrolled parasitic path would lower the trigger voltage at the gate of the power MOSFET 1, which is undesirable and limits the operating voltage of the overall ESD protection circuit. Thus, in the absence of a solution, the HVAC circuit may not provide sufficient protection for many applications that require a much larger safe operating range.

Embodiments of the present invention overcome these and other issues and reduce and/or eliminate the parasitic leakage paths by incorporating voltage divider connections 81 and resistors into the first trigger element circuit 8. Each voltage divider connection 81 is a shorted connection between the emitter 902 of a transistor 91 and a resistor 31 so that the shorted base/emitter voltage ($V_{BE}$) is greater than the collector/emitter voltage ($V_{CE}$) and is closer to the breakdown voltage between the collector and base. Thus, this prevents or dramatically lowers the leakage current through the parasitic path described above. There is one less voltage divider connection 81 than the number of transistors 91 in the trigger element string 8. Voltage divider connections 81 connect each resistor 31 across the base 903 and emitter 902 of each transistor 91 in the first trigger element string 8. Accordingly, the first trigger element string 8 differs from the second trigger element string 9 due to the additional resistors 31 and voltage divider connections 81.

Figure 3:
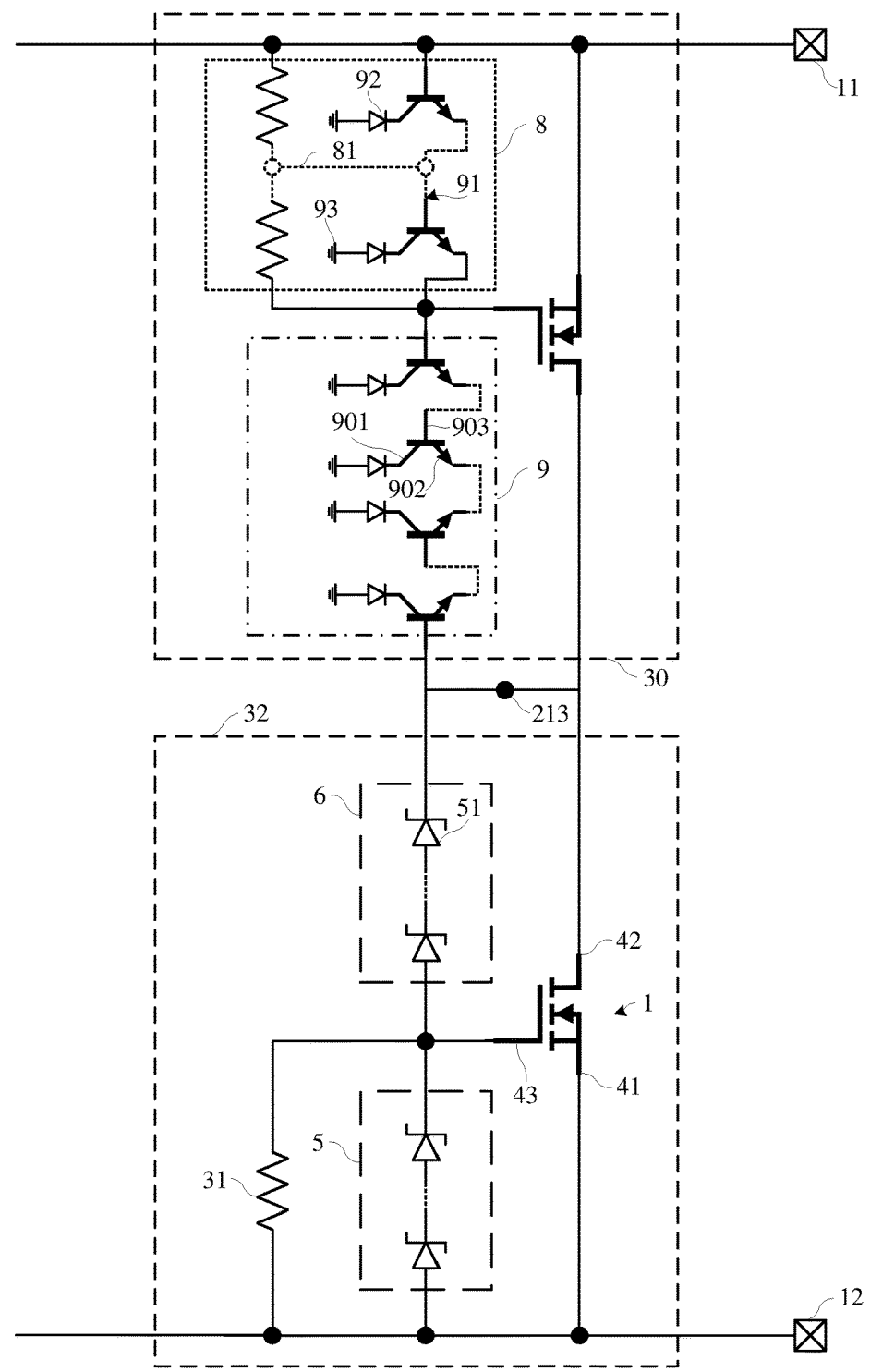
FIG. 3 illustrates a schematic diagram of an HVAC circuit for the protection of a circuit against both negative and positive overvoltages (relative to a reference voltage) which result from ESD events according to embodiments of the present invention.

FIG. 3 illustrates a schematic diagram of an HVAC circuit for the protection of a circuit against overvoltages relative to a reference voltage which result from ESD events according to an embodiment of the present invention. According to this embodiment, the HVAC circuit is designed to specifically protect against both positive overvoltages and negative overvoltages.

According to this embodiment, a first ESD protection circuit 30 is connected anti-serially with respect to another second ESD protection circuit 32. The first ESD protection circuit 30 protects a device from negative overvoltages whereas the second ESD protection circuit 32 protects the device from positive overvoltages. The magnitudes of the respective trigger voltages $V_{TR}$ may be identical or different for each trigger circuit depending on the protection requirements of the protected device.

The HVAC circuit includes a first ESD protection circuit 30 and a second ESD protection circuit 32 connected between a first circuit node 11 and a second circuit node 12.

The first ESD protection circuit 30 is connected between the first circuit node 11 and a circuit node 213. According to this embodiment, the first ESD protection circuit 30 is responsible for the protection of a device against negative overvoltages. In one embodiment, the first ESD protection circuit 30 is the HVAC circuit of the previous embodiment described with respect to FIG. 1.

The HVAC circuit further includes a second ESD protection circuit 32 connected between the circuit node 213 and the second circuit node 12.

According to this embodiment, similar to the first ESD protection circuit 30, the second ESD protection circuit 32 includes a discharge element that is implemented using a power MOSFET 1 operating in enhancement mode. The power MOSFET 1 of the second ESD protection circuit 32 includes drain 42, source 41, and gate 43 connections.

In this embodiment, the second ESD protection circuit 32 also includes a first trigger element string 5, a second trigger element string 6, and a resistor 31. In one embodiment, the first trigger element string 5 and the second trigger element string 6 include a plurality of Zener diodes 51.

The first trigger element string 5 is connected between the gate 43 of the power MOSFET 1 and the second circuit node 12. Additionally, a resistor 31 is connected between the gate 43 of the power MOSFET 1 and the second circuit node 12 such that the resistor 31 is in parallel with the first trigger element string 5. The second trigger element string 6 is connected between the circuit node 213 and the gate 43 of the power MOSFET 1. Similar to the previous embodiment, the first trigger element string 5 is configured for protection against gate oxide breakdown of the power MOSFET 1 whereas the second trigger element string 6 is configured to trigger the power MOSFET 1 to conduct the overvoltage current across the load path during an ESD event.

Figure 4:
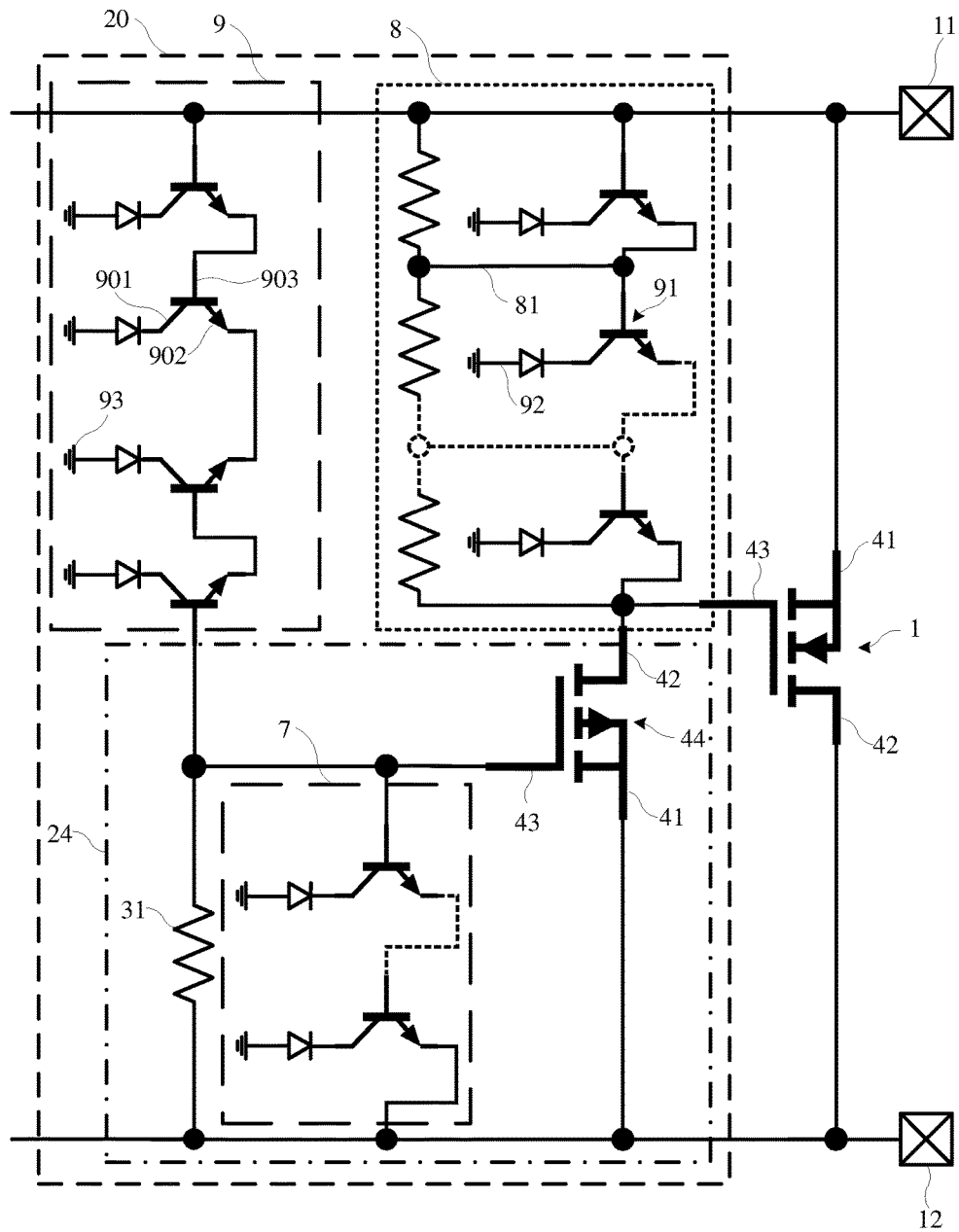
FIG. 4 illustrates a schematic diagram of an HVAC circuit for the protection of a circuit against negative overvoltages (relative to a reference voltage) which result from ESD events according to an embodiment of the present invention.

FIG. 4 illustrates a schematic diagram of an HVAC circuit for the protection of a circuit against negative overvoltages (relative to a reference voltage) which result from ESD events according to an embodiment of the present invention. The HVAC circuit can conduct higher overvoltage currents at lower voltages than the previous embodiment circuits by including an amplification circuit. The amplification circuit is used to amplify the gate to source voltage at the power MOSFET. The embodiment described in FIG. 1 may not be able to reach the desired gate to source voltage that gives the maximum failure current. The amplification circuit may be used to overcome this issue in this embodiment.

Similar to prior embodiments, the HVAC circuit includes a trigger circuit 20 and a large power MOSFET 1 as the discharge element. The power MOSFET 1 is connected between a first circuit node 11 and a second circuit node 12 with source 41, drain 42, and gate 43 connections.

However, unlike prior embodiments, in addition to the first and second trigger element strings 8, 9, the trigger circuit 20 of this embodiment includes a third trigger element string 7 and a p-channel MOSFET (pMOS transistor 44) operating in enhancement mode as part of an amplification circuit 24 with the body and the source 41 of the pMOS transistor 44 connected to the second circuit node 12 and the drain 42 of the pMOS transistor 44 connected to the gate 43 of the power MOSFET 1. The third trigger element string 7 is connected between the gate 43 of the pMOS transistor 44 and the second circuit node 12. The pMOS transistor 44 acts as an amplification stage by increasing the signal at the gate 43 of the power MOSFET 1 which allows a higher current to pass through the power MOSFET 1 at a lower voltage. The third trigger element string 7 is configured for protection against gate oxide breakdown of the pMOS transistor 44.

This embodiment HVAC circuit has the advantage of lower on-resistance for the HVAC circuit compared to the previous embodiment circuits while still maintaining IC area efficiency. As before the inclusion of resistor 31 and voltage divider connections 81 to the trigger element string 8 between the gate 43 and source 41 connections of the power MOSFET 1 prevents or dramatically lowers the leakage current through the parasitic paths as previously described.

Figure 5:
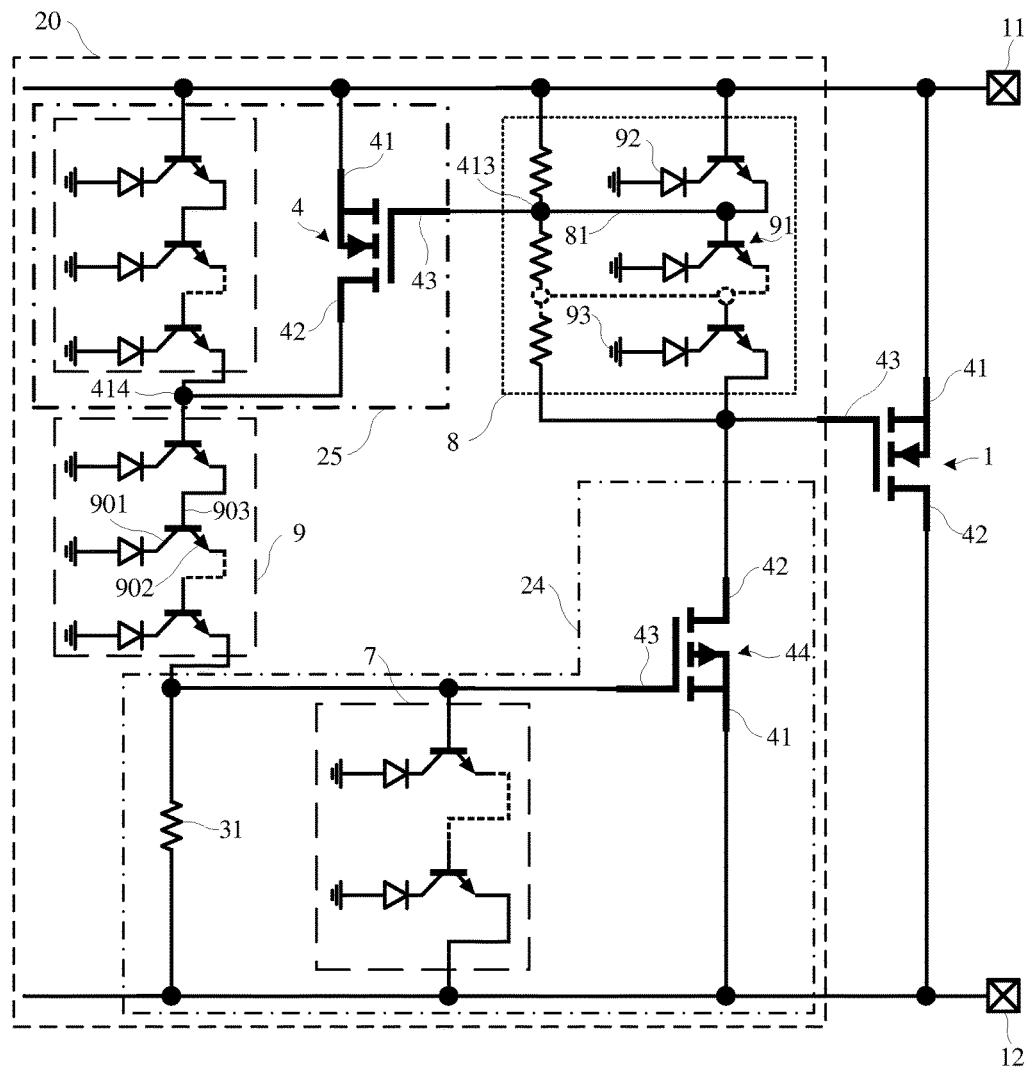
FIG. 5 illustrates a schematic diagram of an HVAC circuit for the protection of a circuit against negative overvoltages (relative to a reference voltage) which result from ESD events according to an embodiment of the present invention.

FIG. 5 illustrates a schematic diagram of an HVAC circuit for the protection of a circuit against negative overvoltages relative to a reference voltage which result from ESD events according to an embodiment of the present invention. The HVAC circuit can conduct higher overvoltage currents at lower voltages than previous embodiment circuits by including a snapback control circuit.

The amplification circuit 24 described in FIG. 4 may still not be able to reach the optimal gate to source voltage, for example, if the trigger voltage is larger than the failure voltage for reaching the maximum achievable failure current. This embodiment overcomes this by using a bypass circuit that changes the operating point of the power MOSFET as further described below.

In this embodiment, as previously described, the HVAC circuit includes a trigger circuit 20 and a power MOSFET 1 as the discharge element. The power MOSFET 1 is connected between a first circuit node 11 and a second circuit node 12 with source 41, drain 42, and gate 43 connections.

In this embodiment, an nMOS transistor 4 operating in enhancement mode is included in the HVAC circuit as part of a snapback control circuit 25 to provide snapback functionality. During snapback, the threshold voltage of the nMOS transistor 4 is met or exceeded and a portion of the second trigger element string 9 is bypassed after the nMOS transistor 4 is turned on. At this point the power MOSFET 1 is forced to snapback to a different operating point with a higher current and lower voltage allowing the maximal achievable failure current to be attained. The gate 43 of the nMOS transistor 4 is connected to a first circuit node 413 located between two resistors 31 in the first trigger element string 8. The drain 42 of the nMOS transistor 4 is connected to a second circuit node 414 located at a base-emitter junction between two transistors 91 in the second trigger element string 9. Finally, the source 41 of the nMOS transistor 4 is connected to the first circuit node 11.

Figure 6:
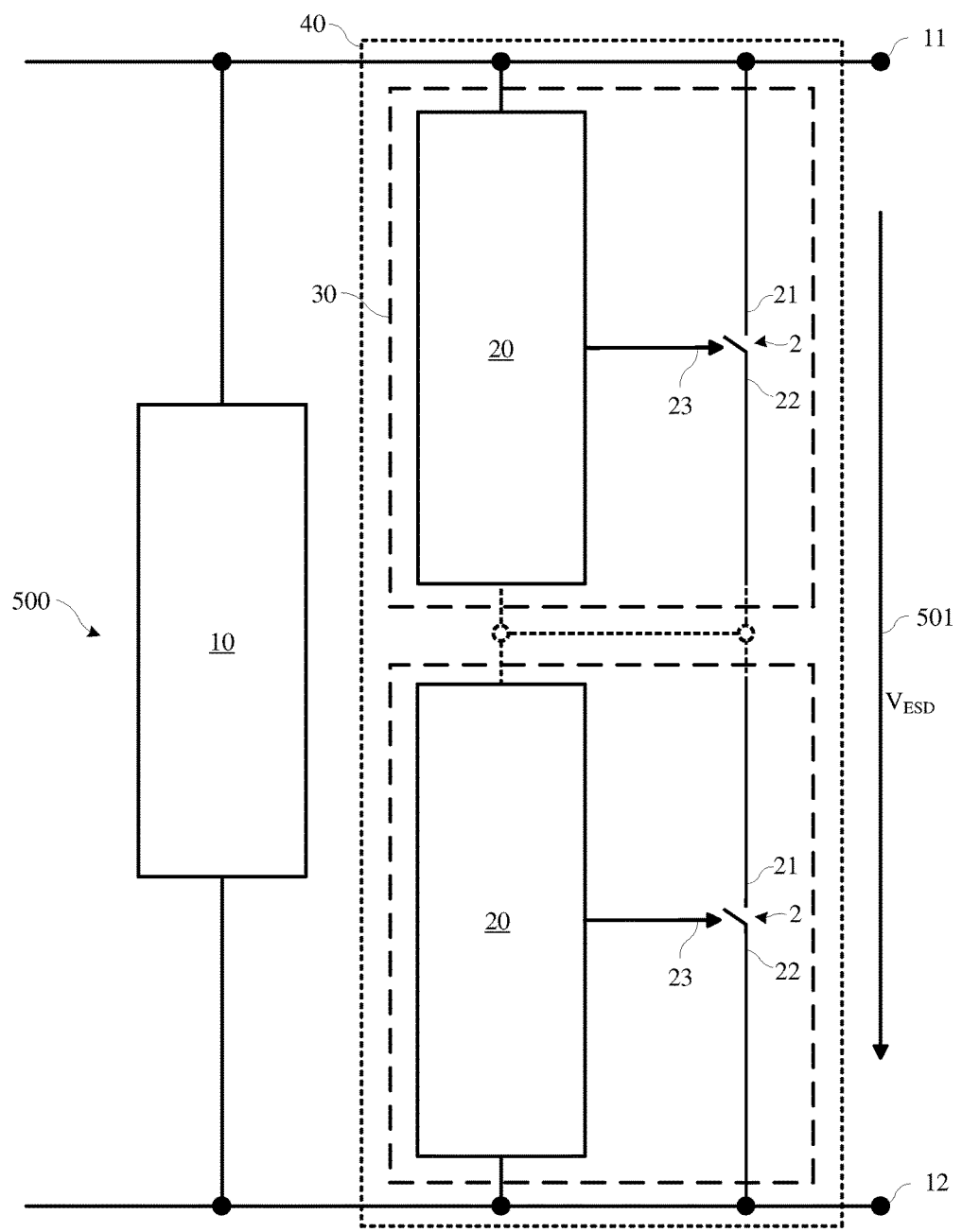
FIG. 6 illustrates a schematic diagram of an ESD protection system for the protection of a circuit against overvoltages (relative to a reference voltage) which result from ESD events according to an embodiment of the present invention.

FIG. 6 illustrates a schematic diagram of an ESD protection system for the protection of a circuit against overvoltages (relative to a reference voltage) which result from ESD events according to an embodiment of the present invention.

According to various embodiments, the ESD protection system includes a device under protection (DUP) 10 and an ESD protection circuit string 40 connected between a first circuit node 11 and a second circuit node 12. In various embodiments, the ESD protection circuit string 40 provides a path for the majority of a positive or negative overvoltage current to pass from the first circuit node 11 to the second circuit node 12 (or vice versa) without passing through the DUP 10.

According to various embodiments, a plurality of ESD protection circuits 30 may be connected between the first and second circuit nodes 11, 12 forming an ESD protection circuit string 40. For example, referring to FIG. 6, a first ESD protection circuit 30 may protect the DUP 10 from negative overvoltages according to a negative trigger voltage and a second ESD protection circuit 32 connected anti-serially with respect to the first ESD protection circuit 30 may protect the DUP 10 from positive overvoltages according to a positive trigger voltage. In one embodiment, the first and second ESD protection circuits 30, 32 are the first and second ESD protection circuits 30, 32 of FIG. 3 respectively. In another embodiment, the first ESD protection circuits 30 may be the trigger circuit 20 and the power MOSFET 1 of FIGS. 3 and 4. Alternatively, two or more ESD protection circuits 30 may be connected serially between the first and second circuit nodes 11, 12 to achieve a voltage protection class that is much higher than is possible by using an individual protection circuit. In various embodiments, additional external or internal connections to a circuit node may be made possible through incorporation of a physical pad, terminal, or solder point at the circuit node, for example.

According to various embodiments, the ESD protection circuit 30 includes a trigger circuit 20 and a discharge element 2. As described in previous embodiments, the discharge element 2 provides an alternative pathway for the majority of the overvoltage current in the event that the trigger voltage $V_{TR}$ is met or exceeded by the voltage $V_{ESD}$ 501 during a voltage transient event. Each discharge element 2 includes a first load path connection 21 and a second load path connection 22. The passage of overvoltage current through a given discharge element 2 is controlled by a respective controlled connection 23 between a given trigger circuit 20 and the associated discharge element 2. The discharge element 2 is illustrated schematically as a switch in FIG. 6. In one embodiment, the discharge element 2 is an n-channel power MOSFET. In other embodiments, the discharge element 2 might be a BJT, p-channel MOSFET, JFET, or thyristor, for example.

As described in various embodiments, the trigger circuit 20 incorporates voltage dividers to reduce or eliminate parasitic current pathways arising due to open/floating nodes within the trigger circuit 20.

Figure 7A:
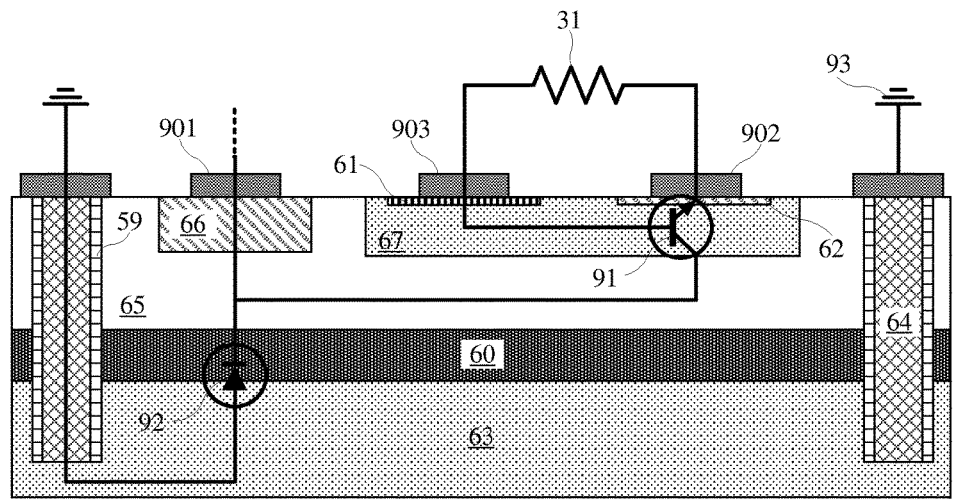

FIG. 7A illustrates a cross section of a trigger element which is a device implementation of a transistor 91 with a resistor 31 connecting the emitter 902 and the base 903. Discrete devices can be used to make individual units of trigger element strings 8 for use in trigger circuits 20 for negative protection HVAC circuits without detrimental parasitic currents.

Referring to FIG. 7A, according to various embodiments, a doped buried region 60 is formed in or on top of a doped substrate 63. In one embodiment, the doped buried region is a highly doped n-type region. In one embodiment, the doped substrate is a p-type substrate and a p-type silicon substrate in one embodiment. An optional doped region 65 may be formed in or on top of the doped buried region 60. In various embodiments, the doped buried region 60 and the optional doped region 65 may be epitaxial layers. A doped well region 67 is then formed in or on top of the optional doped region 65. In one embodiment, the doped well region 67 is a p-type well region. A collector region 66 is then formed in or on top of the optional doped region 65. A base region 61 and an emitter region 62 are then formed in or on top of the doped well region 67. In one embodiment the base region 61 is a p-type region, and the collector region 66 and emitter region 62 are n-type regions. Accordingly, a Zener diode is formed between the emitter region 62 and the doped well region 67. In various embodiments, the collector, base, and emitter regions may comprise multiple doped regions and are shown as a single layer only for clarity. Finally, deep trenches 64 are formed on both sides of the structure to isolate the transistor 91 from other elements on the IC. The deep trenches 64 may comprise p-type doping forming sinker structures contacting the doped substrate 63 in one embodiment. The deep trenches 64 are lined with an insulating liner 59 to avoid shorting the regions.

Conductive contacts are formed contacting the collector region 66, emitter region 62 and the base region 61 corresponding to the collector 901, emitter 902, and base 903 terminals of a transistor 91. In various embodiments, the conductive contacts may be formed from a metal, silicide, or doped semiconductor material, for example. A representative transistor 91 circuit element is shown at the appropriate junctions.

According to various embodiments, a resistor 31 is connected across the base 903 and the emitter 902 of the transistor 91. The resistor 31 may be a discrete circuit element connected across physical terminals or may be integrated onto the same substrate. In one embodiment, the resistor 31 may be a polysilicon resistor integrated over the doped substrate 63.

A representative substrate diode 92 is shown at the junction between the p-type substrate and the n-type region. The substrate diode 92 is shown connected to ground 93, according to one embodiment. Alternatively, the substrate diode 92 may be connected to a reference voltage that is different the ground voltage.

Figure 7B:
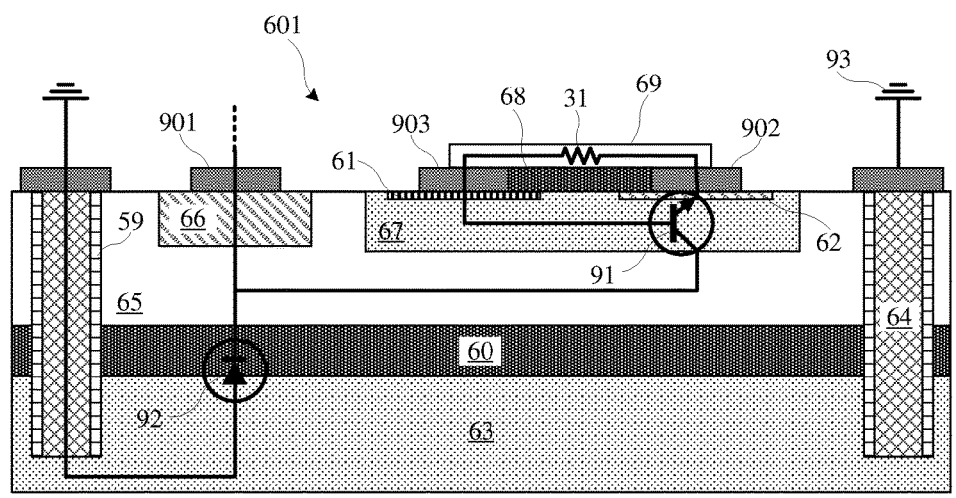

FIG. 7B illustrates a cross section of a trigger circuit element which is an integrated circuit implementation of a transistor 91 with a resistor 31 connecting the emitter 902 and the base 903. In one embodiment, the resistor 31 is implemented as an integrated resistor 31 by forming an insulating layer 68 and a resistive layer 69 forming a trigger element IC 601. In another embodiment, the resistive layer 69 is a resistive region formed within the device. The resistive layer 69 makes contact with the base 903 and the emitter 902. The resistive layer 69 may be a polysilicon layer.

In one embodiment, an additional insulating layer may be formed on top of the device to protect and encapsulate the device. In one embodiment, the resistor 31 may be integrated in a different location on the IC.

Figure 7C:
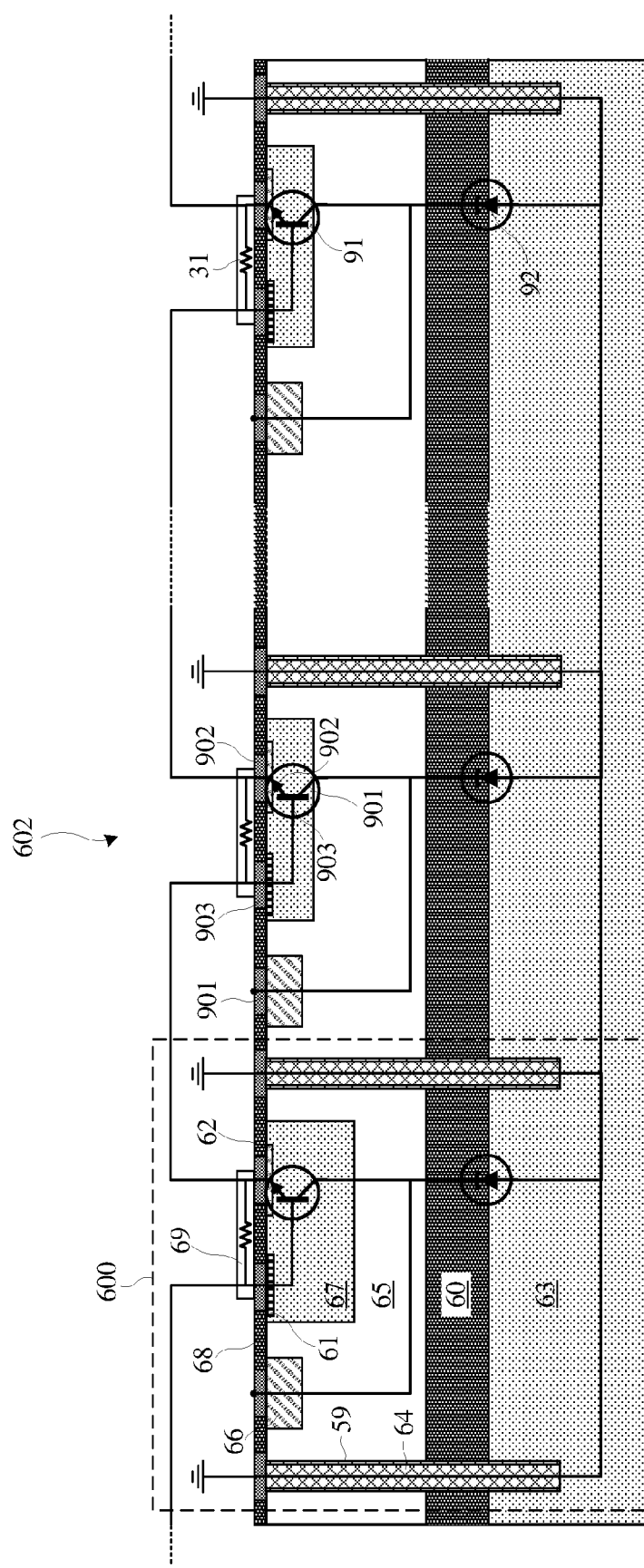

FIG. 7C illustrates a cross section of a trigger element string IC which is an integrated circuit implementation of a trigger element string 8, for example, the trigger element string 8 illustrated in FIGS. 1-4. According to various embodiments, the trigger element string IC includes a plurality of trigger element ICs 601 on the same doped substrate 63.

Figure 8A:
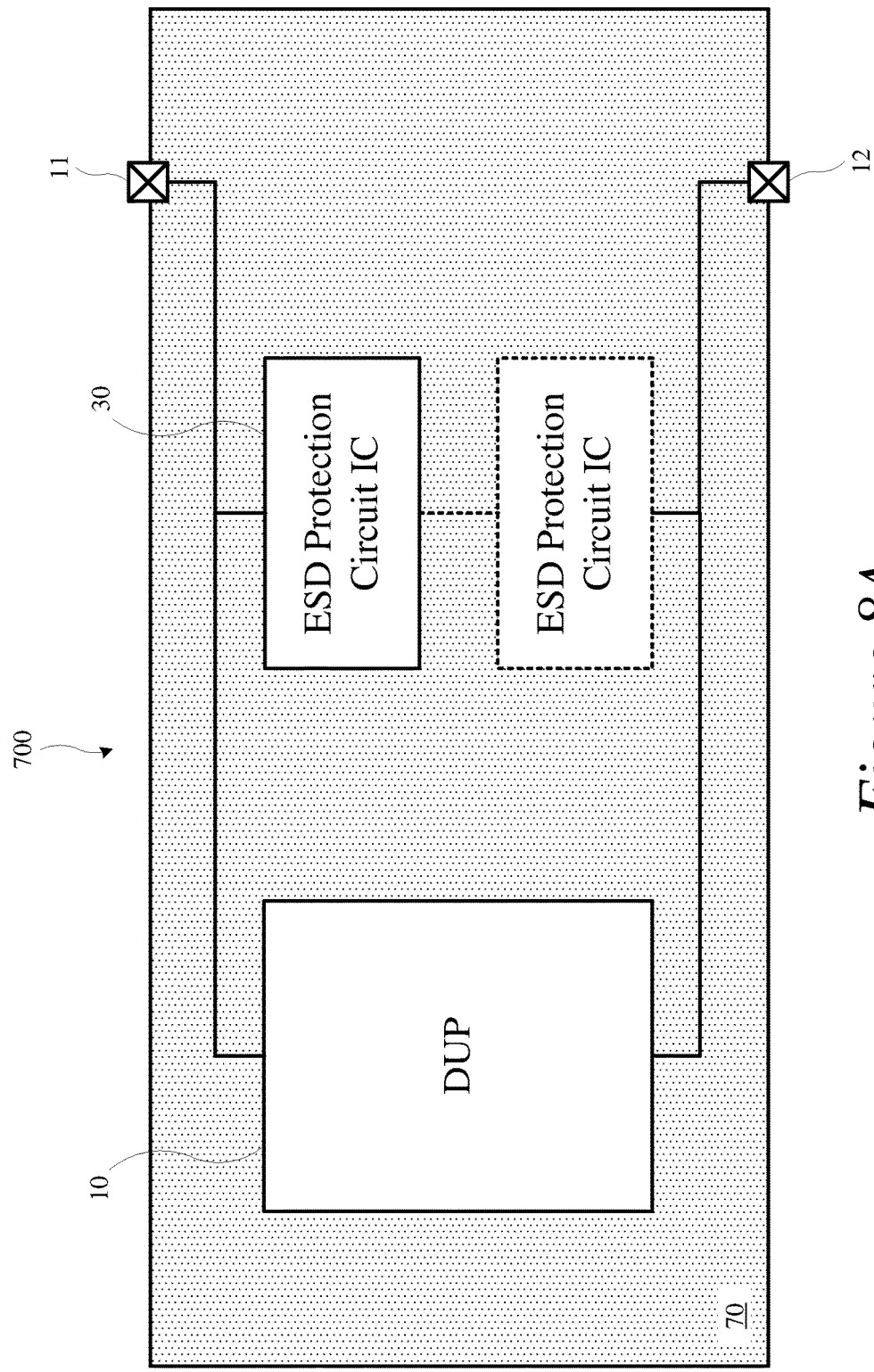
FIGS. 8A, 8B and 8C illustrate schematic diagrams of ESD protection systems for the protection of a circuit against overvoltages (relative to a reference voltage) which result from ESD events according to an embodiment of the present invention, wherein FIG. 8A includes packaged implementations of a DUP and ESD protection circuits, FIG. 8B includes packaged implementations of a DUP, a discharge element, NPN bipolar junction transistors, and trigger elements, and FIG. 8C includes packaged implementations of a DUP, a discharge element, NPN BJTs, and resistors.

FIG. 8A illustrates a schematic diagram of an ESD protection system for the protection of a circuit against overvoltages (relative to a reference voltage) which result from ESD events according to an embodiment of the present invention.

In reference to FIG. 8A, according to various embodiments, the ESD protection system includes a printed circuit board (PCB) 70 or other suitable support structure, a device under protection (DUP) 10, and a plurality of ESD protection circuit ICs 30 connected between a first circuit node 11 and a second circuit node 12. According to this embodiment, the ESD protection system is implemented using discrete packaged integrated circuits for the DUP 10 and the ESD protection circuits 30.

According to one embodiment, the ESD protection circuits 30 are packaged integrated circuit implementations of negative protection HVAC circuits described in previous embodiments. According to another embodiment, the ESD protection circuits 30 are other protection circuits comprising trigger elements 8 in order to prevent undesirable parasitic currents within the protection circuit.

Figure 8B:
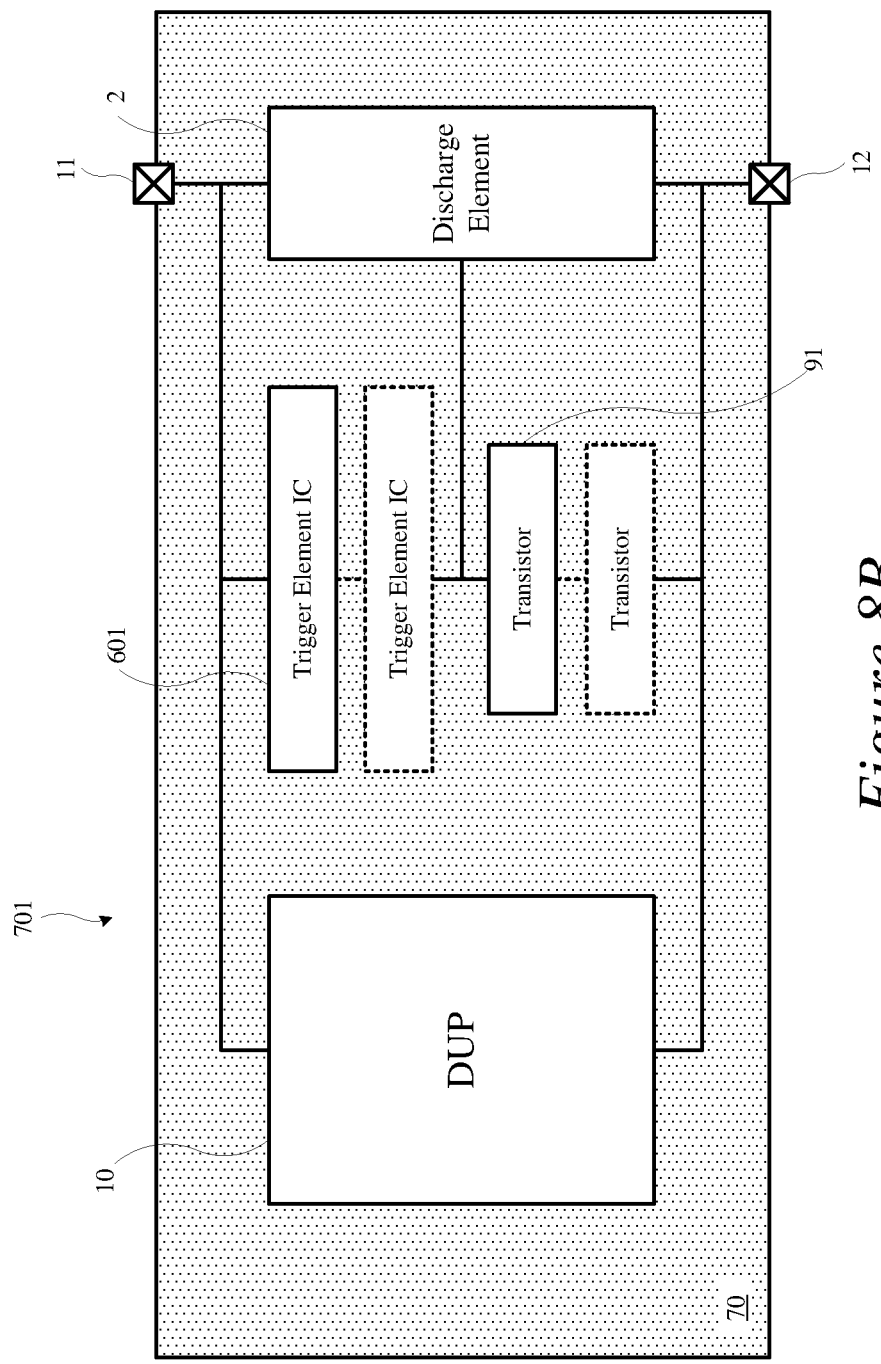

FIG. 8B illustrates a schematic diagram of an ESD protection system for the protection of a circuit against overvoltages (relative to a reference voltage) which result from ESD events according to an embodiment of the present invention. According to this embodiment, the ESD protection system includes a discharge element 2, a plurality of trigger element ICs 601, and a plurality of transistors 91 connected between a first circuit node 11 and a second circuit node 12. In one embodiment, the transistors 91 are NPN bipolar junction transistors (BJTs) including a Zener diode and are Zener NPNs. In one embodiment, the trigger element ICs 601 include a Zener NPN and a resistor on a common semiconductor substrate as illustrated in FIG. 7B.

According to one embodiment, constituent trigger element ICs 601 may be packaged as discrete components. In one embodiment, the packaging is a plastic casing. Alternatively, other suitable packaging may be used.

Figure 8C:
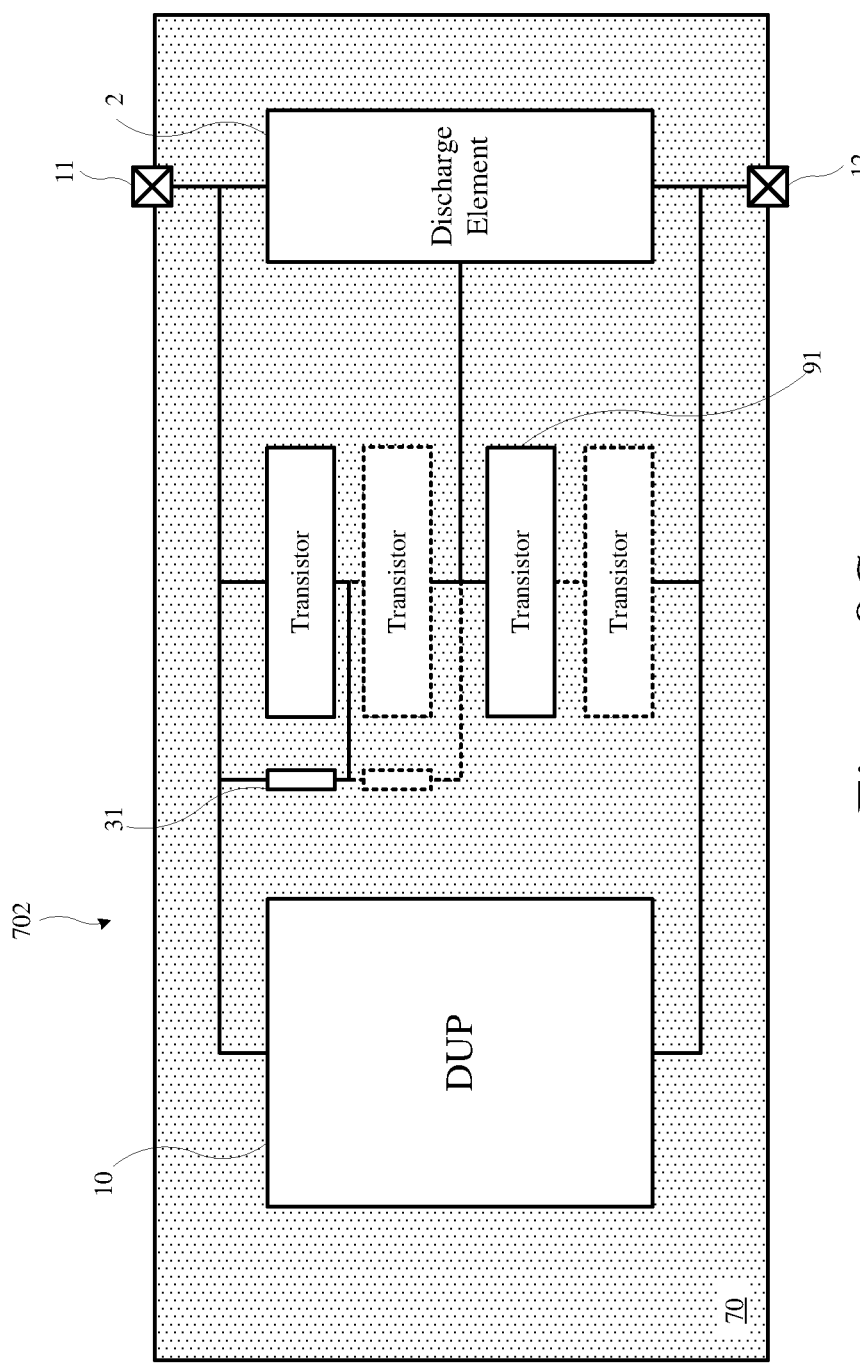

FIG. 8C illustrates a schematic diagram of an ESD protection system for the protection of a circuit against overvoltages (relative to a reference voltage) which result from ESD events according to an embodiment of the present invention. According to this embodiment, the ESD protection system includes a discharge element 2, a plurality of transistors 91, which may be discrete Zener NPNs, and a plurality of resistors 31 connected between a first circuit node 11 and a second circuit node 12.

According to one embodiment, constituent transistors 91 and resistors 31 may be packaged as discrete components. In one embodiment, the packaging is a plastic casing. Alternatively, other suitable packaging may be used.

Although embodiments of the present invention have been described using NPN transistors used as trigger elements for an nMOS, the same principle may be used for a trigger circuit comprising a PNP transistor that is used for triggering a discharge element comprising a pMOS that are built on an n-type substrate. In such embodiments, the voltage dividers may be used to improve immunity to positive ESD stress.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transient voltage protection circuit comprising:
   a first input/output pad;
   a second input/output pad;
   a trigger circuit coupled between the first input/output pad and the second input/output pad comprising
      a first trigger element comprising
         a first input/output node,
         a second input/output node,
         a third input/output node, and
         a first substrate diode coupled to the third input/output node of the first trigger element,
      a first resistor coupled between the first input/output node of the first trigger element and the second input/output node of the first trigger element,
      a second trigger element comprising
         a first input/output node,
         a second input/output node,
         a third input/output node, wherein the second input/output node of the first trigger element is coupled to the first input/output node of the second trigger element, and
         a second substrate diode coupled to the third input/output node of the second trigger element, and
      a second resistor coupled between the first input/output node of the second trigger element and the second input/output node of the second trigger element; and
   a discharge transistor comprising
      a first input/output node coupled to the first input/output pad of the transient voltage protection circuit, a second input/output node coupled to the second input/output pad of the transient voltage protection circuit, and a control node coupled to the trigger circuit.

2. The transient voltage protection circuit of claim 1, wherein the first trigger element and the second trigger element are each a bipolar junction transistor.

3. The transient voltage protection circuit of claim 2, wherein the first input/output node of the first trigger element and the first input/output node of the second trigger element are a base terminal of the bipolar junction transistor, wherein the second input/output node of the first trigger element and the second input/output node of the second trigger element are an emitter terminal of the bipolar junction transistor, and wherein the third input/output node of the first trigger element and the third input/output node of the second trigger element are a collector terminal of the bipolar junction transistor.

4. The transient voltage protection circuit of claim 3, wherein the bipolar junction transistor is an NPN bipolar junction transistor.

5. The transient voltage protection circuit of claim 1, wherein the trigger circuit is configured to prevent breakdown between the control node and the first input/output node of the discharge transistor.

6. The transient voltage protection circuit of claim 1, wherein the trigger circuit further comprises an amplification circuit.

7. The transient voltage protection circuit of claim 1, wherein the trigger circuit further comprises a snapback control circuit.

8. The transient voltage protection circuit of claim 1, wherein the transient voltage protection circuit is configured to discharge a voltage that is negative relative to a ground voltage through the discharge transistor.

9. An electrostatic discharge (ESD) protection circuit comprising:
a power MOSFET for discharging an electrostatic discharge current coupled between an input pad and an output of the ESD protection circuit;
a trigger circuit for triggering the power MOSFET, the trigger circuit coupled to a gate node of the power MOSFET, the trigger circuit comprising:
a first trigger element string for controlling a gate to source voltage of the power MOSFET, wherein each trigger element of the first trigger element string comprises a bipolar transistor, a substrate diode, and a voltage divider to divide a voltage across adjacent trigger elements of the first trigger element string; and
a second trigger element string for triggering the gate of the power MOSFET.

10. The electrostatic discharge (ESD) protection circuit of claim 9, wherein the power MOSFET is configured to discharge a voltage that is negative relative to a ground voltage.

11. The electrostatic discharge (ESD) protection circuit of claim 10, wherein the power MOSFET is configured to discharge a voltage that is more negative relative to a ground voltage than −20 V.

12. The electrostatic discharge (ESD) protection circuit of claim 9, further comprising a trigger circuit configured to trigger the power MOSFET to discharge the voltage during a transient voltage event.

13. The electrostatic discharge (ESD) protection circuit of claim 12, wherein the trigger circuit is configured to prevent gate source breakdown of the power MOSFET.

14. The electrostatic discharge (ESD) protection circuit of claim 12, wherein the trigger circuit further comprises an amplification circuit configured to amplify a signal at the power MOSFET during a transient voltage event.

15. The electrostatic discharge (ESD) protection circuit of claim 12, wherein the trigger circuit further comprises a snapback control circuit configured to decrease the voltage and increase a current at the power MOSFET after the power MOSFET has already been triggered to discharge the voltage during a transient voltage event.

16. An electrostatic discharge (ESD) protection device comprising:
a first trigger transistor disposed above a semiconductor substrate having a first doping type, the first trigger transistor comprising: a first buried region of a second doping type disposed over the semiconductor substrate, a first well region of the first doping type, a first doped region of the first doping type disposed in the first well region, a second doped region of the second doping type disposed in the first well region, and a third doped region of the second doping type disposed over the first buried region, wherein the second doping type is opposite to the first doping type, and wherein the second doped region and the first well region form a first Zener diode;
a first substrate diode at an interface between the semiconductor substrate and the first well region; and
a first resistive layer disposed in or over the semiconductor substrate, the first resistive layer coupled between the first doped region and the second doped region.

17. The electrostatic discharge (ESD) protection device of claim 16, wherein the first trigger transistor is an NPN bipolar junction transistor.

18. The electrostatic discharge (ESD) protection device of claim 16, further comprising: a trench extending through the first buried region and into the semiconductor substrate, the trench comprising a doped material comprising the first doping type and lined with an insulating liner.

19. The electrostatic discharge (ESD) protection device of claim 16, further comprising: a second trigger transistor disposed above the semiconductor substrate, the second trigger transistor comprising: a second buried region of the second doping type disposed over the semiconductor substrate, a second well region of the first doping type, a fourth doped region of the first doping type disposed in the second well region, a fifth doped region of the second doping type disposed in the second well region, and a sixth doped region of the second doping type disposed over the second buried region, wherein the second doping type is opposite to the first doping type, wherein the fifth doped region and the second well region form a second Zener diode;
a second substrate diode at an interface between the semiconductor substrate and the second well region; and
a second resistive layer disposed in or over the semiconductor substrate, the second resistive layer coupled between the fourth doped region and the fifth doped region.

20. An electrostatic discharge protection system comprising:
a circuit board comprising a first pad and a second pad;
a device under protection bonded to the circuit board coupled between the first pad and the second pad;
a power MOSFET bonded to the circuit board coupled between the first pad and the second pad, the power MOSFET comprising a control node, wherein the power MOSFET is configured to discharge a voltage that is negative relative to a ground voltage;

a plurality of Zener NPN transistors bonded to the circuit board and coupled in series between the first pad and the control node of the power MOSFET; and a plurality of resistors coupled between each of the plurality of Zener NPN transistors, wherein the plurality of resistors are configured to divide a voltage across adjacent ones of the plurality of Zener NPN transistors.

21. The electrostatic discharge protection system of claim 20, wherein each resistor of the plurality of resistors is bonded to the circuit board.

22. The electrostatic discharge protection system of claim 20, wherein each resistor of the plurality of resistors and each transistor of the plurality of Zener NPN transistors is disposed over a plurality of semiconductor substrates, wherein each of the semiconductor substrates comprises one of the plurality of resistors and one of the plurality of Zener NPN transistors.

23. The electrostatic discharge protection system of claim 20, wherein each resistor of the plurality of resistors and each transistor of the plurality of Zener NPN transistors is disposed over a common semiconductor substrate, wherein common semiconductor substrate comprises all of the plurality of resistors and all of the plurality of Zener NPN transistors.

24. The transient voltage protection circuit of claim 1, wherein the trigger circuit further comprises:

a third resistor; and a third trigger element comprising:

a first input/output node coupled to the second input/output node of the second trigger element, a second input/output node couple to the control node of the discharge transistor, a third input/output node, and a third substrate diode coupled to the third input/output node of the third trigger element, wherein the third resistor is coupled between the first input/output node of the third trigger element and the second input/output node of the third trigger element.

* * * * *